(12) United States Patent
Tsuchiya et al.

(10) Patent No.: US 8,461,632 B2
(45) Date of Patent: Jun. 11, 2013

(54) SIC SEMICONDUCTOR DEVICE AND METHOD OF MANUFACTURING THE SAME

(75) Inventors: Noriaki Tsuchiya, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 269 days.

(21) Appl. No.: 12/911,304

(22) Filed: Oct. 25, 2010

(65) Prior Publication Data

US 2011/0193100 A1 Aug. 11, 2011

(30) Foreign Application Priority Data

Feb. 9, 2010 (JP) ................................ 2010-026062

(51) Int. Cl.
*H01L 21/02* (2006.01)

(52) U.S. Cl.
USPC ........... 257/288; 257/192; 257/281; 257/335; 257/368; 257/473; 257/E21.063; 257/E21.066; 257/E21.341; 257/E29.066; 257/E29.298

(58) Field of Classification Search
USPC ................... 257/77, 192, 281–288, 335–368, 257/422, 473, E21.041, 63–66, 341–2, 452, 257/29.066, 84, 104, 297, 298
See application file for complete search history.

(56) References Cited

U.S. PATENT DOCUMENTS

| | | | |
|---|---|---|---|
| 4,717,685 A * | 1/1988 | Nakajima | 438/172 |
| 6,083,781 A * | 7/2000 | Zolper et al. | 438/167 |
| 6,096,627 A * | 8/2000 | Harris et al. | 438/520 |
| 6,940,110 B2 * | 9/2005 | Takahashi et al. | 257/288 |
| 6,979,863 B2 * | 12/2005 | Ryu | 257/335 |
| 7,029,969 B2 | 4/2006 | Tarui et al. | |
| 7,285,465 B2 | 10/2007 | Tarui et al. | |
| 7,381,992 B2 * | 6/2008 | Ryu | 257/77 |

(Continued)

FOREIGN PATENT DOCUMENTS

| | | |
|---|---|---|
| CN | 1669160 A | 9/2005 |
| JP | 8-107064 | 4/1996 |

(Continued)

OTHER PUBLICATIONS

Korean Office Action dated Oct. 29, 2012, with a Japanese translation of the Korean Office Action and a Partial English Translation of the Japanese translation of the Korean Office Action.

(Continued)

*Primary Examiner* — Michael Lebentritt
(74) *Attorney, Agent, or Firm* — Oblon, Spivak, McClelland, Maier & Neustadt, L.L.P.

(57) ABSTRACT

A method of manufacturing an SiC semiconductor device according to the present invention includes the steps of (a) by using a single mask, etching regions of an SiC semiconductor layer which serve as an impurities implantation region and a mark region, to form recesses, (b) by using the same mask as in the step (a), performing ion-implantation in the recesses of the regions which serve as the impurities implantation region and the mark region, at least from an oblique direction relative to a surface of the SiC semiconductor layer and (c) positioning another mask based on the recess of the region which serves as the impurities implantation region or the mark region, and performing well implantation in a region containing the impurities implantation region.

2 Claims, 14 Drawing Sheets

U.S. PATENT DOCUMENTS

| | | | | |
|---|---|---|---|---|
| 7,521,737 | B2 * | 4/2009 | Augusto | 257/233 |
| 7,579,229 | B2 * | 8/2009 | Sugii et al. | 438/199 |
| 7,709,403 | B2 * | 5/2010 | Yamashita et al. | 438/786 |
| 8,288,220 | B2 * | 10/2012 | Hull et al. | 438/212 |
| 8,294,217 | B2 * | 10/2012 | Ema et al. | 257/368 |
| 2009/0104762 | A1 * | 4/2009 | Kusumoto et al. | 438/530 |
| 2012/0153303 | A1 * | 6/2012 | Uchida | 257/77 |

FOREIGN PATENT DOCUMENTS

| | | |
|---|---|---|
| JP | 10-041527 | 2/1998 |
| JP | 11-330091 | 11/1999 |
| JP | 2000-164525 | 6/2000 |
| JP | 2004-319964 | 11/2004 |
| JP | 2008-53363 | 3/2008 |
| JP | 2009-147381 | 7/2009 |
| JP | 2009-170558 A | 7/2009 |

OTHER PUBLICATIONS

Office Action issued Feb. 14, 2012 in Korean Patent Application No. 10-2011-0007112 (English translation of the Korean Office Action is translated based on the Japanese translation).

Office Action with Search Report (with English translation) issued on Jan. 18, 2013, in counterpart Chinese Appln No. 201010559277X (16 pages).

* cited by examiner

SIC SEMICONDUCTOR DEVICE AND METHOD OF MANUFACTURING THE SAME

BACKGROUND OF THE INVENTION

1. Field of the Invention

The present invention relates to a semiconductor device having a mark region and a source region, and particularly an SiC semiconductor device using silicon carbide, and a method of manufacturing the same.

2. Description of the Background Art

The breakdown electric field and the bandgap of silicon carbide are approximately ten times and three times greater than those of silicon, respectively. Accordingly, a power device using silicon carbide can operate at a higher temperature with a low resistance, as compared with a power device using silicon which is currently used. Particularly, a MOSFET and an IGBT using silicon carbide are quite prospective because a small loss occurs in a normal mode and at a time of switching, when compared with a MOSFET and an IGBT using silicon with the same breakdown voltage. Thus, various methods of manufacturing a MOSFET and an IGBT using silicon carbide have been proposed (for example, see Japanese Patent Application Laid-Open No. 2000-164525).

In the MOSFET using silicon carbide, a channel resistance accounts for a half of the on-resistance involved in a loss occurring at a time when current flows. The channel resistance is determined by a channel length Lch which depends on a positional relationship between a p-well region and a source region as shown in FIG. 1. If the channel length Lch varies due to mask misalignment occurring in a step of forming the p-well region and the source region, a chip may be broken by local current concentration in a chip face. Accordingly, how the channel length Lch can be accurately controlled is a significant problem.

In a conventional process of manufacturing a MOSFET using silicon carbide, at the beginning of a wafer process, a mark region is formed which serves as a reference for a mask alignment in a photomechanical process. Then, the mask alignment is performed based on the mark region, to form a p-well region. Moreover, the mask alignment is performed by using the mark region as a reference, to form an n-type source region. Furthermore, a well contact region is formed at the center of the source region. Then, in the same manner, the mask alignment is performed based on the mark region, to form an electrode structure.

SUMMARY OF THE INVENTION

An object of the present invention is to provide a structure of a semiconductor device which suppresses a variation in a channel length, and a method of manufacturing the same.

An SiC semiconductor device according to the present invention includes an SiC semiconductor layer, a well region selectively formed on a surface of the SiC semiconductor layer, and an impurities implantation region selectively formed on a surface of the well region. The impurities implantation region has a recess formed in a region thereof except a region near an end portion on a surface of the impurities implantation region, and the region near the end portion has a hook-like shape curving toward an upper face of the semiconductor layer.

Since the region near the end portion of the impurities implantation region has a hook-like shape curving toward the upper face of the semiconductor layer, an inversion layer can be uniformly formed on a wafer surface.

A method of manufacturing an SiC semiconductor device according to the present invention includes the steps of (a) by using a single mask, etching regions of an SiC semiconductor layer which serve as an impurities implantation region and a mark region, to form recesses, (b) by using the single mask, performing ion-implantation in the recesses of the regions which serve as the impurities implantation region and the mark region, at least from an oblique direction relative to a surface of the SiC semiconductor layer, and (c) positioning another mask based on the recess of the region which serves as the impurities implantation region or the mark region, and performing well implantation in a region containing the impurities implantation region.

Since the etching for the impurities implantation region and the mark region is performed by using the single mask, the impurities implantation region can be formed without any misalignment relative to the mark region, and therefore a variation in a channel length can be suppressed. Moreover, by performing the ion-implantation from the oblique direction, the impurities implantation region can be formed also near the side face of the recess. Therefore, an inversion layer can be uniformly formed on a wafer surface.

A method of manufacturing an SiC semiconductor device according to the present invention includes the steps of (a) by using a single mask, performing ion-implantation in regions of an SiC semiconductor layer which serve as an impurities implantation region and a mark region, at least from an oblique direction relative to a surface of the SiC semiconductor layer, (b) by using the single mask, performing etching to partially remove ion-implanted regions of the regions which serve as the impurities implantation region and the mark region, to form recesses, and (c) positioning another mask based on the recess of the region which serves as the impurities implantation region or the mark region, and performing well implantation in a region containing the impurities implantation region.

Since the etching for the impurities implantation region and the mark region is performed by using the single mask, the impurities implantation region can be formed without any misalignment relative to the mark region, and therefore a variation in a channel length can be suppressed. Moreover, by performing the ion-implantation from the oblique direction, the impurities implantation region can be formed also near the side face of the recess. Therefore, an inversion layer can be uniformly formed on a wafer surface. Additionally, since the etching is performed after the ion-implantation is performed in the formation of the impurities implantation region, the impurities implantation region is not influenced by the etching and can be formed without a variation.

A method of manufacturing an SiC semiconductor device according to the present invention includes the steps of (a) by using a single mask having a low selectivity relative to an SiC semiconductor layer, etching regions of the SiC semiconductor layer which serve as an impurities implantation region and a mark region, to form recesses, (b) by using the single mask, performing ion-implantation in the recesses of the regions which serve as the impurities implantation region and the mark region, and (c) positioning another mask based on the recess of the region which serves as the impurities implantation region or the mark region, and performing well implantation in a region containing the impurities implantation region.

Since the etching is performed by using the mask having a low selectivity relative to the SiC semiconductor layer, the opening of the mask is formed into a tapered shape. Therefore, the thickness of the mask is small in a region near a boundary of the opening. Ions are, through the mask, implanted also in a portion of the SiC semiconductor layer located immediately below the region. Therefore, the impurities implantation region can be stably formed near a side face of the recess, to enable an inversion layer to be uniformly formed on the wafer surface. Furthermore, the end portion of the impurities implantation region is formed into a tapered shape, and therefore there is no steeply-angled portion. Thus, breakdown caused by electric field concentration can be prevented.

A method of manufacturing an SiC semiconductor device according to the present invention includes the steps of (a) by using a single mask having a tapered-shaped opening, performing ion-implantation in regions of an SiC semiconductor layer which serve as an impurities implantation region and a mark region, (b) by using the single mask, performing etching to partially remove ion-implanted regions of the regions which serve as the impurities implantation region and the mark region, to form recesses, and (c) positioning another mask based on the recess of the region which serves as the impurities implantation region or the mark region, and performing well implantation in a region containing the impurities implantation region.

Since the opening of the mask has a tapered shape, the thickness of the mask is small in a region near a boundary of the opening. Ions are, through the mask, implanted also in a portion of the SiC semiconductor layer located immediately below the region. Therefore, the impurities implantation region can be stably formed near a side face of the recess, to enable an inversion layer to be uniformly formed on the wafer surface. Furthermore, the end portion of the impurities implantation region is formed into a tapered shape, and therefore there is no steeply-angled portion. Thus, breakdown caused by electric field concentration can be prevented. Additionally, since the etching is performed after the ion-implantation is performed in the formation of the impurities implantation region, the impurities implantation region is not influenced by the etching and can be formed without a variation.

These and other objects, features, aspects and advantages of the present invention will become more apparent from the following detailed description of the present invention when taken in conjunction with the accompanying drawings.

DESCRIPTION OF THE PREFERRED EMBODIMENTS

Background Technique

As a background technique of the present invention, a process of manufacturing a MOSFET shown in FIG. 1 will be described along steps shown in FIGS. 2 to 6.

Figure 2:
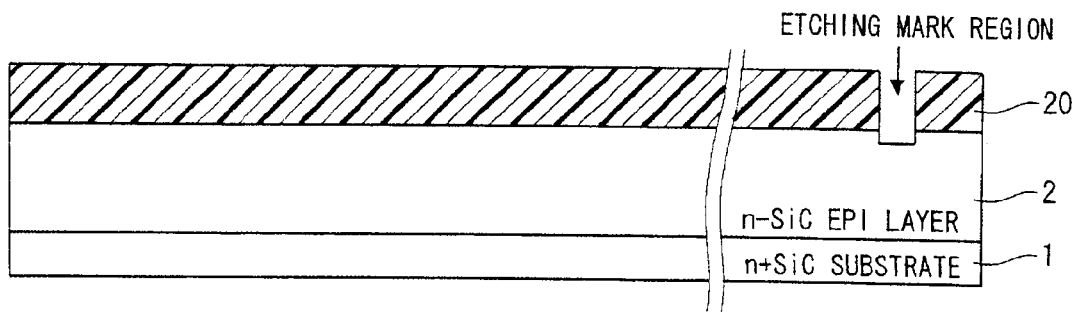
FIG. 2 is a sectional view showing a process of manufacturing an SiC semiconductor device according to a background technique.
Figure 3:
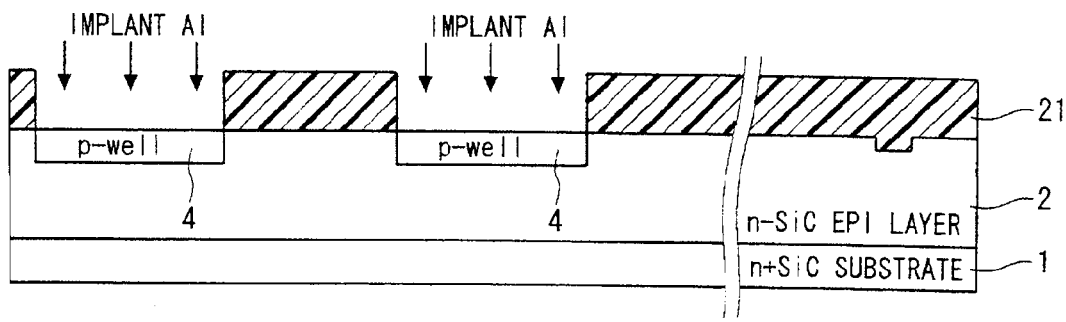
FIG. 3 is a sectional view showing the process of manufacturing the SiC semiconductor device according to the background technique.
Figure 4:
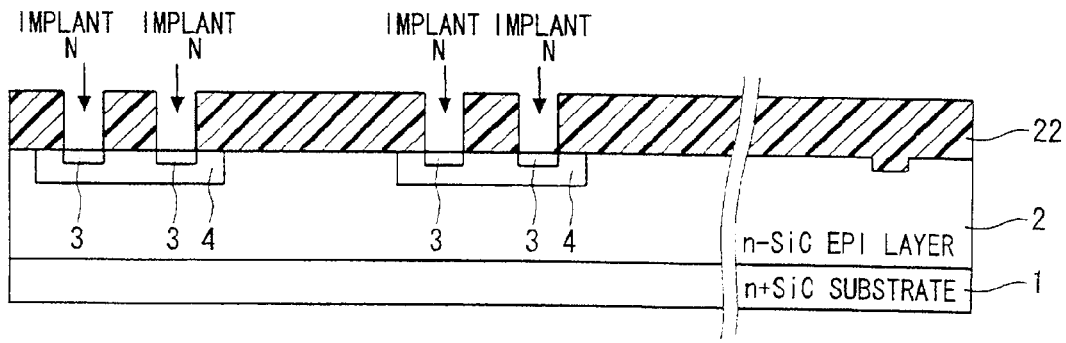
FIG. 4 is a sectional view showing the process of manufacturing the SiC semiconductor device according to the background technique.
Figure 5:
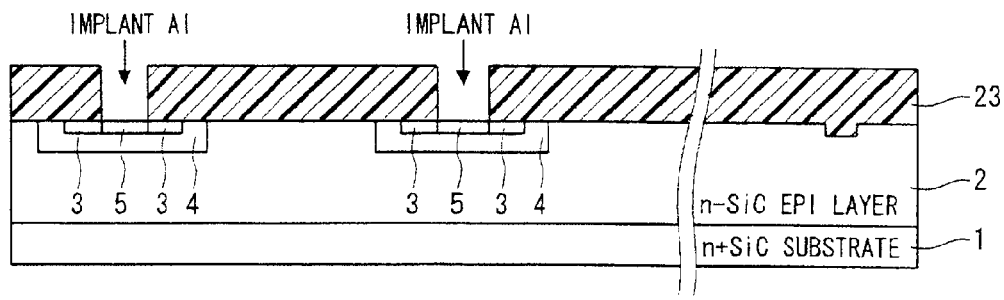
FIG. 5 is a sectional view showing the process of manufacturing the SiC semiconductor device according to the background technique.
Figure 6:
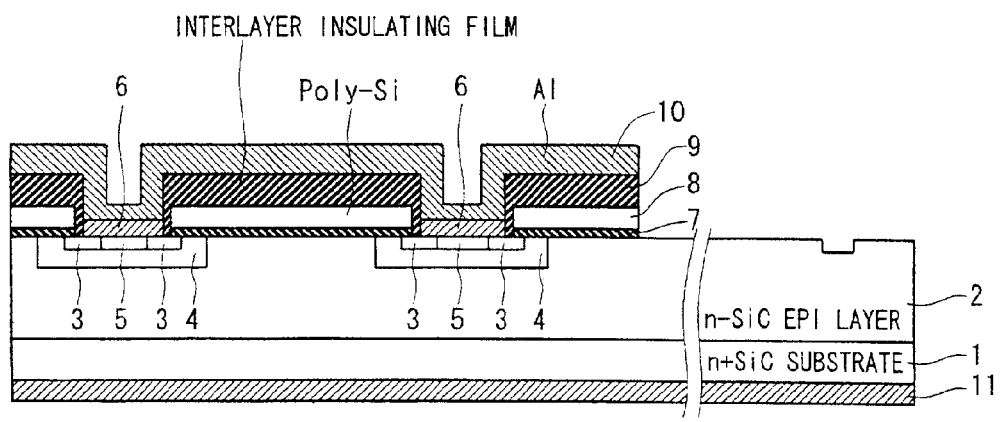
FIG. 6 is a sectional view showing the process of manufacturing the SiC semiconductor device according to the background technique.

Firstly, by using a mask 20, a wafer having an n–SiC epi (epitaxial) layer 2 formed on an n–SiC substrate 1 is etched to form a mark region (FIG. 2). Then, a mask 21 is formed based on the mark region, and Al is implanted, to form a p-well region 4 (FIG. 3). Additionally, a mask 22 is formed based on the mark region, and N ions are implanted, to form an n-type source region 3 (FIG. 4). In the same manner, a mask 23 is formed based on the mark region, and Al ions are implanted, to form a well contact region 5 at the center of the source region 3 (FIG. 5). Subsequently, in the same manner, a mask alignment is performed based on the mark region, to form an electrode structure (FIG. 6). In the electrode structure, the reference numerals 6, 7, 8, 9, 10, and 11 represent a Ni film, a gate oxide film, a poly-Si, an interlayer insulating film, an Al film, and a drain electrode, respectively.

Figure 1:
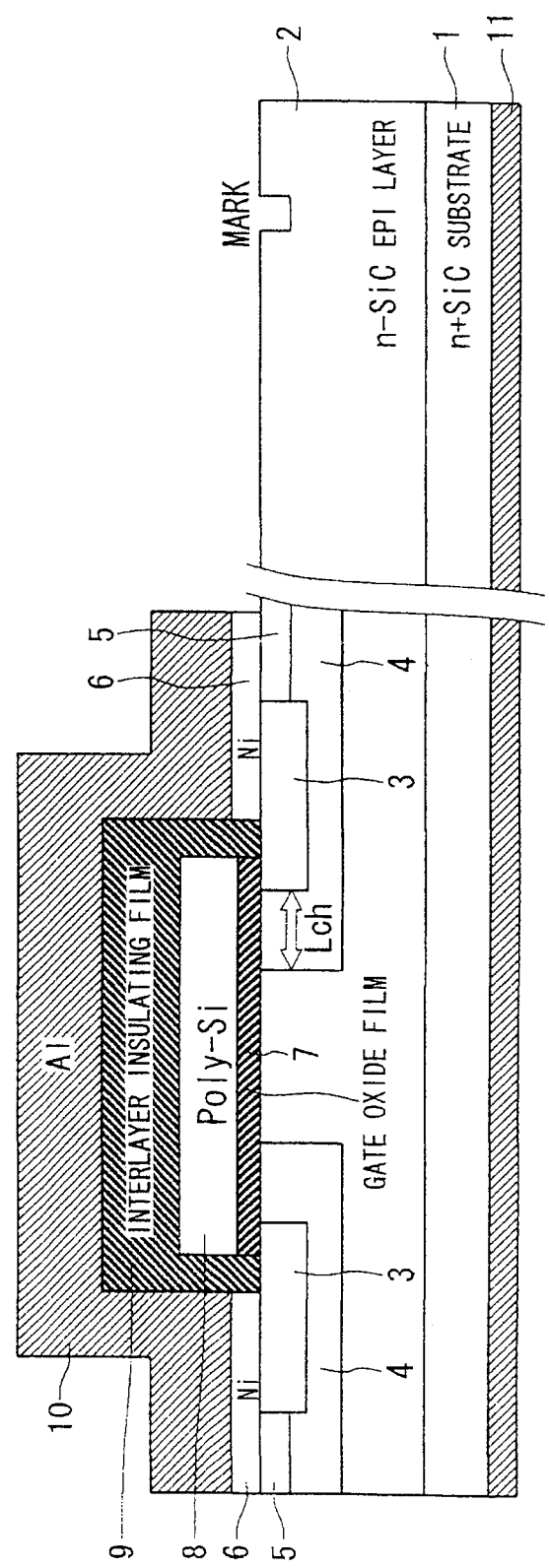
FIG. 1 is a sectional view showing a structure of an SiC semiconductor device.

If the mask alignments are performed based on the etched portion of the mark region when the source region 3 and the p-well region 4 are formed as described above, a mask misalignment in each step is repeated, to cause a large variation in a channel length Lch (see FIG. 1).

Therefore, in a process of manufacturing a MOSFET which is an SiC semiconductor device according to the present invention, a mark region and a source region 3 are etched by using the single mask, and subsequent mask alignments are performed based on an etched portion of the mark region or the source region 3 (since the amount of mask misalignment between the mark region and the source region 3 is zero, either the mark region or the source region 3 can serve as a reference). In this manner, a variation in the channel length Lch is suppressed.

Preferred Embodiment 1

If the mark region and the source region 3 are simultaneously formed by performing etching and ion implantation by using a single mask, an etched portion of the source region 3 is formed without any misalignment from the reference mark region. If, in subsequent source forming steps, a mask alignment is performed by using the etched portion of the mark region or the source region 3, a variation in the channel length Lch can be suppressed because the source region 3 is formed without any misalignment from the mark region.

Figure 7:
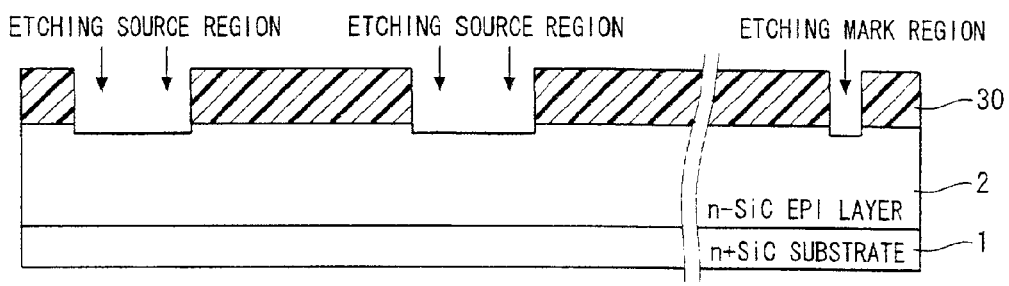
FIG. 7 is a sectional view showing a process of manufacturing an SiC semiconductor device according to the present invention.

Along the procedure shown in FIGS. 7 to 11, a description will be given of an exemplary process of manufacturing a MOSFET in which etching and ion implantation for forming the mark region and the source region 3 are simultaneously performed. Firstly, by using a single mask 30, etching for the source region 3 and the mark region is performed on an SiC semiconductor layer including an n+SiC substrate 1 and an n–SiC epi layer 2 formed on the n+SiC substrate 1, and thereby recesses (having a depth of 0.2 μm) are formed (FIG. 7). Each of the mask 30, and masks 31 and 32 which will be described later, are made of a resist mask or a hard mask such as an oxide film or a nitride film.

Figure 8:
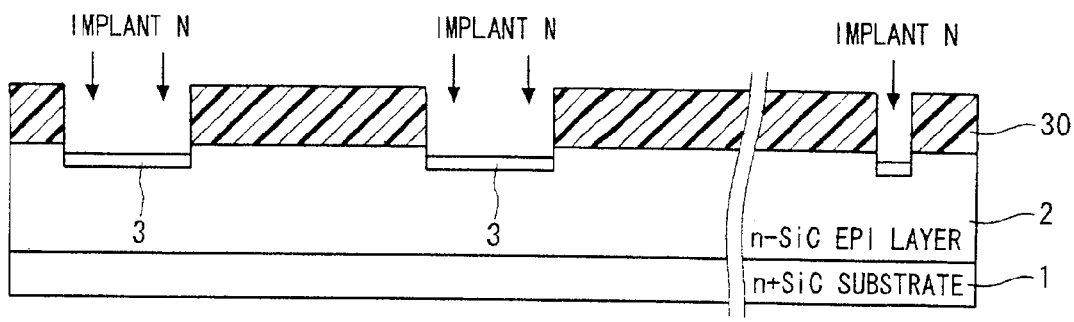
FIG. 8 is a sectional view showing the process of manufacturing the SiC semiconductor device according to the present invention.

Then, by using the same single mask 30 again, N (nitrogen) or P (phosphorus) are vertically ion-implanted with an implantation amount of $3\times10^{19}$ cm$^{-3}$, to thereby form an n-type source region 3 (having a depth of 0.4 μm) (FIG. 8).

Figure 9:
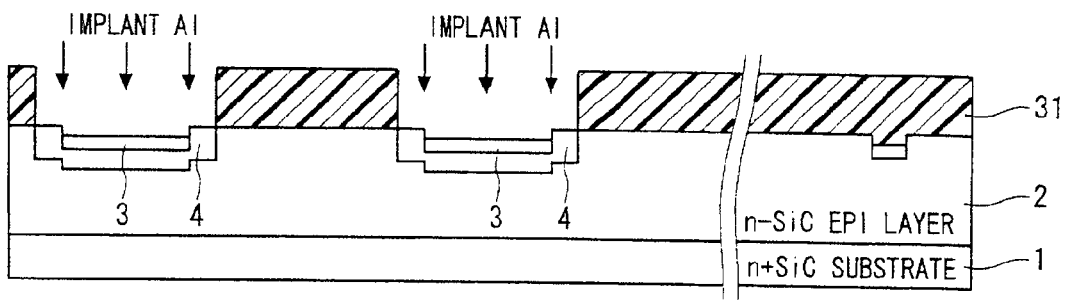
FIG. 9 is a sectional view showing the process of manufacturing the SiC semiconductor device according to the present invention.

Then, Al (aluminum) or B (boron) are ion-implanted by using a p-well implantation mask 31 which is aligned based on the recess of the mark region or the source region 3, to form a p-well region 4 (having a depth of 1.0 μm) (FIG. 9). At this time, the recess is formed in the source region 3, and therefore a part of the p-well region 4 formed immediately under the source region 3 corresponds to the amount of level difference caused by the recess. In this manner, since the p-well region 4 has an umbilicus-shaped structure, the breakdown strength can be improved.

Figure 10:
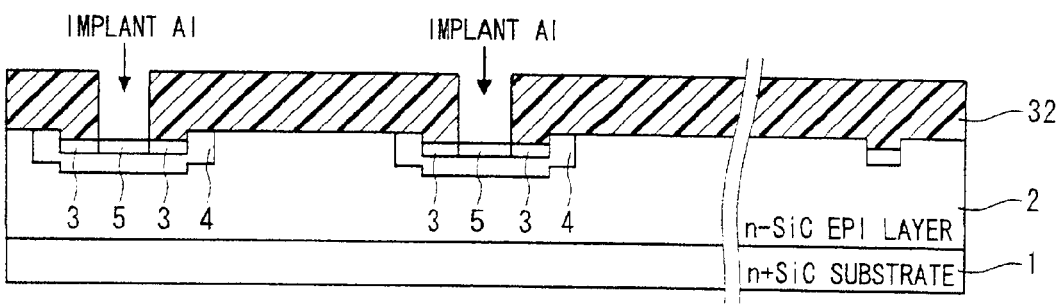
FIG. 10 is a sectional view showing the process of manufacturing the SiC semiconductor device according to the present invention.

Subsequently, by using a well contact implantation mask 32 aligned based on the recess of the mark region or the source region 3, Al or B are ion-implanted, to form a well contact region 5 at the center of the source region 3 (FIG. 10). The Al or the B are ion-implanted at a higher concentration, as compared with the amount in the p-well implantation or the source implantation. Here, for the first time, the complete source region 3 is formed.

Figure 11:
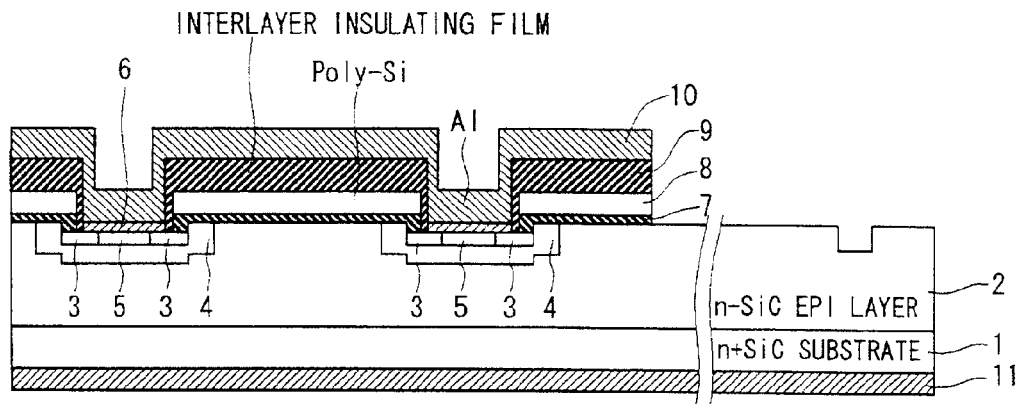
FIG. 11 is a sectional view showing the process of manufacturing the SiC semiconductor device according to the present invention.

In the following, although a detailed description is omitted, high temperature activation annealing is performed, and the gate oxide film 7, the poly-Si gate electrode 8, the interlayer insulating film 9, the source electrodes 6, 10, the drain electrode 11, and the like, are sequentially formed, so that a MOSFET shown in FIG. 11 is completed. Here, the drain electrode 11 may be formed of Ni for example, or alternatively a multi-layer metal.

By simultaneously etching regions where the mark region and the source region 3 are to be formed, the number of steps can be reduced and the manufacturing process can be simplified, as compared with when the mark region and the source region 3 are separately formed. As a result, a work period can be shortened, and costs can be reduced. Moreover, by simultaneously forming the mark region and the source region 3, a mask misalignment of the source region 3 relative to a mark reference need not be considered, and a positioning accuracy of the source region 3 relative to the well region 4 is greatly improved. This can suppress a variation in the channel length Lch to a minimum level, and the quality of a chip can be improved because the chip can be prevented from being broken by current concentration which is caused by a variation in the on-resistance.

In the manufacturing process shown in FIGS. 7 to 11, the etching for the mark region and the source region 3 is firstly performed (FIG. 7), and then the ion implantation is performed (FIG. 8). However, there is a possibility that the shape of a resist pattern changes due to the etching, to cause the source region 3 to vary in the subsequent ion-implantation step. To prevent this problem, it is desirable to perform the etching after performing the ion implantation, as shown in FIGS. 12 to 16.

Figure 12:
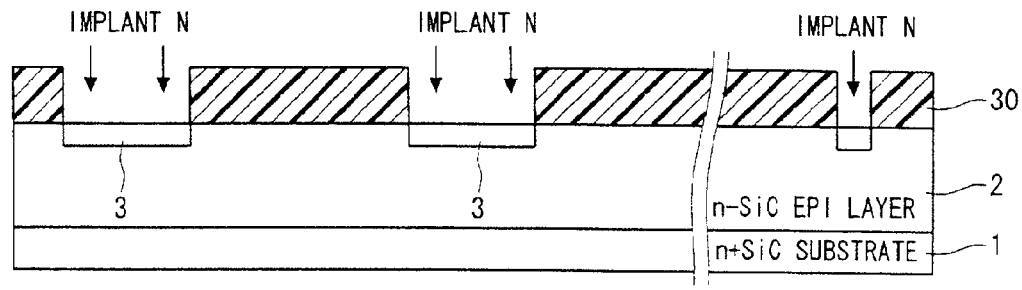
FIG. 12 is a sectional view showing a process of manufacturing an SiC semiconductor device according to the present invention.
Figure 13:
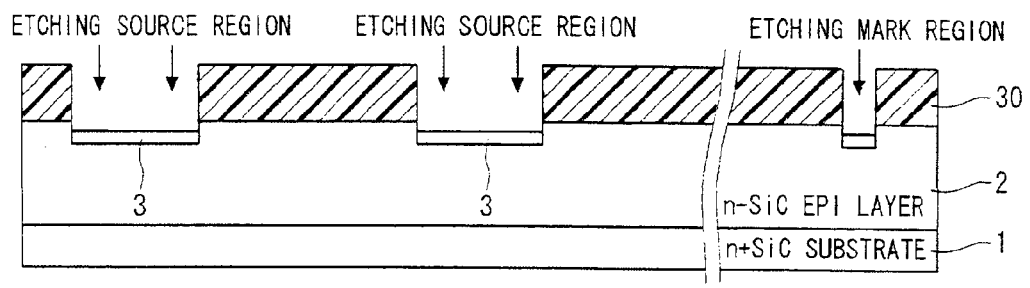
FIG. 13 is a sectional view showing the process of manufacturing the SiC semiconductor device according to the present invention.
Figure 14:
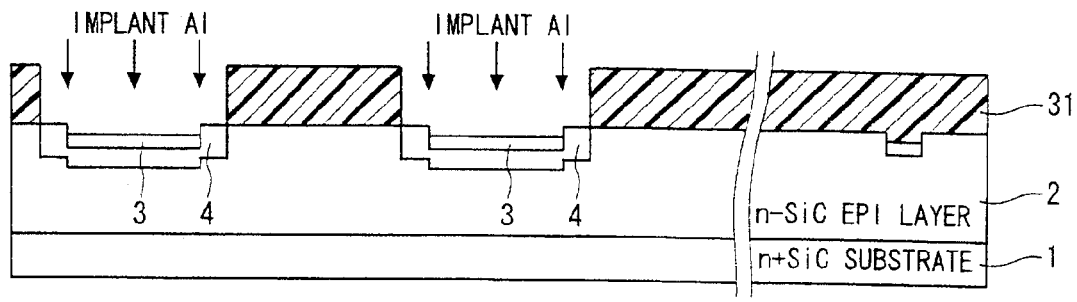
FIG. 14 is a sectional view showing the process of manufacturing the SiC semiconductor device according to the present invention.
Figure 15:
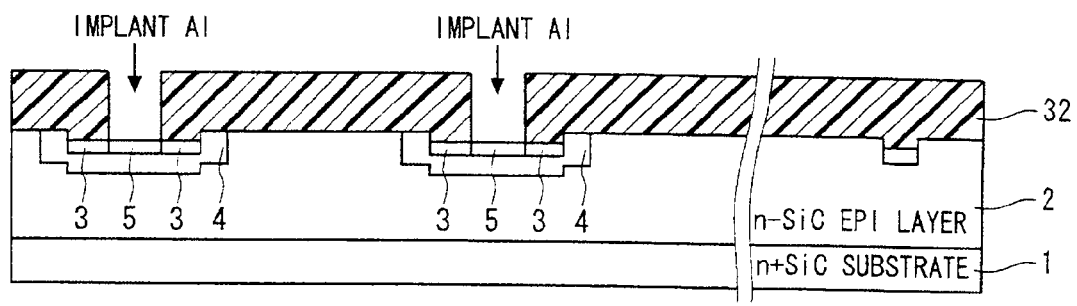
FIG. 15 is a sectional view showing the process of manufacturing the SiC semiconductor device according to the present invention.

Firstly, in a semiconductor layer including the n+SiC substrate 1 and an n−SiC epi layer 2 formed on the n+SiC substrate 1, N or P are vertically ion-implanted in regions where the source region 3 and the mark region are to be formed, by using the single mask 30 (FIG. 12). Additionally, etching is performed by using the same mask 30 again, to form a recess (FIG. 13).

Then, similarly to the process described with reference to FIGS. 7 to 11, the p-well region 4 (FIG. 14) and the well contact region 5 (FIG. 15) are formed based on the recess of the mark region or the source region 3. Moreover, high temperature activation annealing is performed, and the gate oxide film 7, the poly-Si gate electrode 8, the interlayer insulating film 9, the source electrode 6, the drain electrode 11, and the like, are sequentially formed. Thus, a MOSFET shown in FIG. 16 is completed.

In this manufacturing process, the etching for the source region 3 is performed after the ion-implantation. This can prevent the source region 3 from varying due to a change of the shape of the resist pattern which is caused by the etching. However, in the ion-implantation step, a deep implantation has to be performed in advance in consideration of a depth of the etching.

<Angled Implantation>

Figure 16:
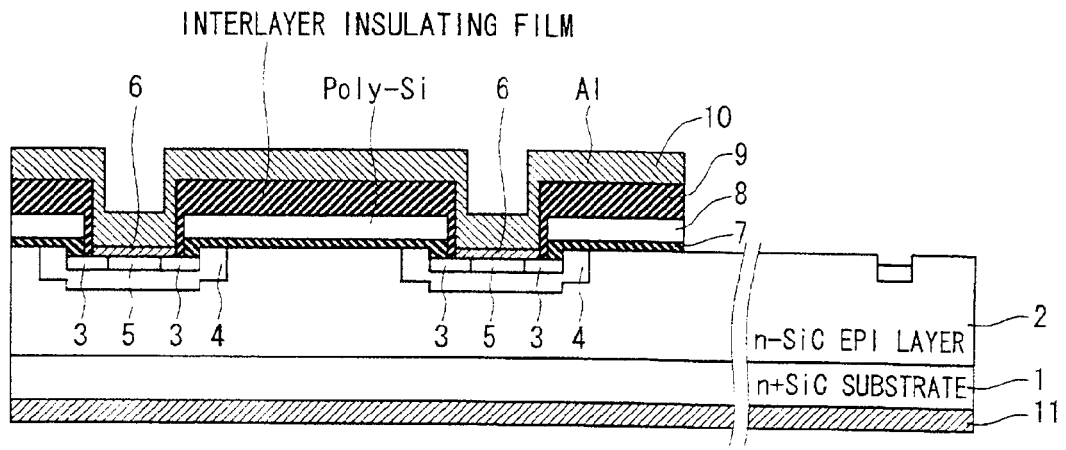
FIG. 16 is a sectional view showing the process of manufacturing the SiC semiconductor device according to the present invention.

However, when a MOSFET is formed by using SiC as a material through the process shown in FIGS. 7 to 11 or the process shown in FIGS. 12 to 16, the following problem arises. In SiC, unlike Si, an implanted element hardly diffuses in a lateral direction. Therefore, in the ion-implantation step shown in FIG. 8 and FIG. 12, the source region 3 does not spread in the lateral direction from an opening of the mask 30, but is formed immediately downward. On the other hand, since the source region 3 is formed simultaneously with the mark region, a wafer surface is etched and an upper face of the source region 3 forms a recess. Accordingly, in the subsequent step, the gate oxide film is formed not only on the wafer surface but also on a side face of the recess (in a cross-sectional direction of the wafer), as shown in FIG. 11 and FIG. 16.

SiC has a hexagonal crystalline structure. A speed of oxidization differs between in a wafer surface ((0001) face) direction and in a cross-sectional direction. For example, when the wafer cross-sectional direction is a (11-20) face, the gate oxide film 7 in the cross-sectional direction is several times thicker than that in the surface direction (although FIGS. 11 and 16 show that the gate oxide film 7 in the cross-sectional direction is nearly twice thicker than that in the surface direction, it is actually still thicker). The channel is formed along the hook-shaped gate oxide film 7. Here, there has been a problem that a channel resistance is unstable because the thickness of the gate oxide film 7 varies as described above.

Moreover, the gate oxide film 7 in the cross-sectional direction is influenced by an accuracy of the recess-etching process, and the film thickness thereof varies due to the accuracy. If the gate oxide film 7 is thick, an inversion layer is hardly formed. As a result, the formation of the inversion layer differs or varies between the wafer surface (a surface of the well region 4) and the side face of the recess (in the cross-sectional direction of the wafer).

To solve these problems, it is necessary to form the source region 3 also in a portion of the SiC epi layer 2 at the side face of the recess, to thereby stably form the inversion layer only on the wafer surface. An example of such a manufacturing process is shown in FIGS. 17 to 22. FIGS. 17 to 22 show a manufacturing process in which an angled implantation is performed in the ion-implantation step of the manufacturing process shown in FIGS. 7 to 11.

Figure 17:
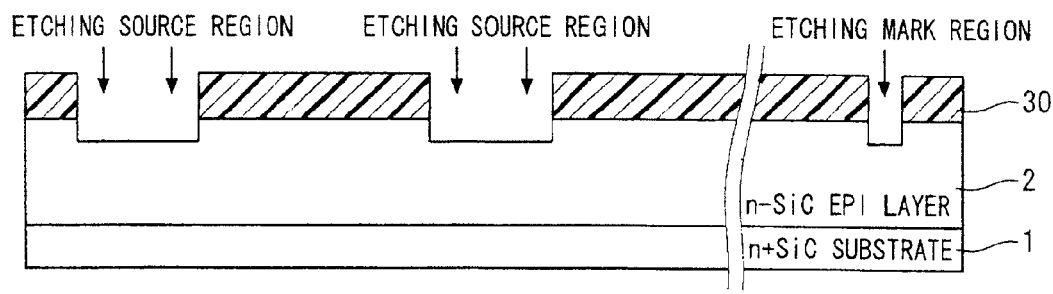
FIG. 17 is a sectional view showing a process of manufacturing an SiC semiconductor device according to the present invention.

Firstly, similarly to the process shown in FIGS. 7 to 11, by using the single mask 30 in which a mark-portion opening and a source-portion opening are formed, etching is performed on a semiconductor layer including an n+SiC substrate 1 and an n−SiC epi layer 2 formed on the n+SiC substrate 1, and thereby recesses (having a depth of 0.2 µm) of the mark region and the source region 3 are formed (FIG. 17). Here, a region defined by a combination of the complete source region 3 and the well contact region 5 formed in the source region 3 is formed so as to have a recess shape. Each of the mask 30, and masks 31 and 32 which will be described later, are made of a resist mask or a hard mask such as an oxide film or a nitride film.

Figure 18:
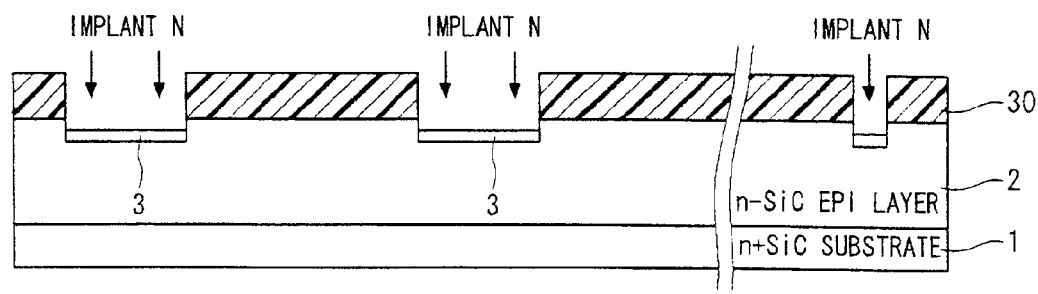
FIG. 18 is a sectional view showing the process of manufacturing the SiC semiconductor device according to the present invention.
Figure 19:
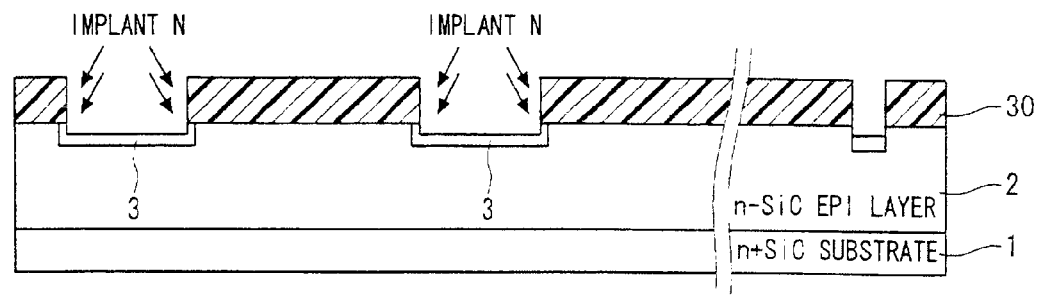
FIG. 19 is a sectional view showing the process of manufacturing the SiC semiconductor device according to the present invention.

Then, by using the same mask 30 again, N or P are vertically ion-implanted with an implantation amount of $3 \times 10^{19}$ cm$^{-3}$, to thereby form an n-type source region 3 (having a depth of 0.4 µm) (FIG. 18). Furthermore, the same ion-implantation is performed with rotation of the wafer, or performed obliquely at an angle of approximately 5 to 30° relative to the direction perpendicular to the wafer (FIG. 19). Thereby, the source region 3 can be also formed at a portion of the n−SiC epi layer 2 near the side face of the recess. Here, the step of FIG. 18 may be omitted, and the ion-implantation may be formed obliquely or with rotation of the wafer, from the start.

Figure 20:
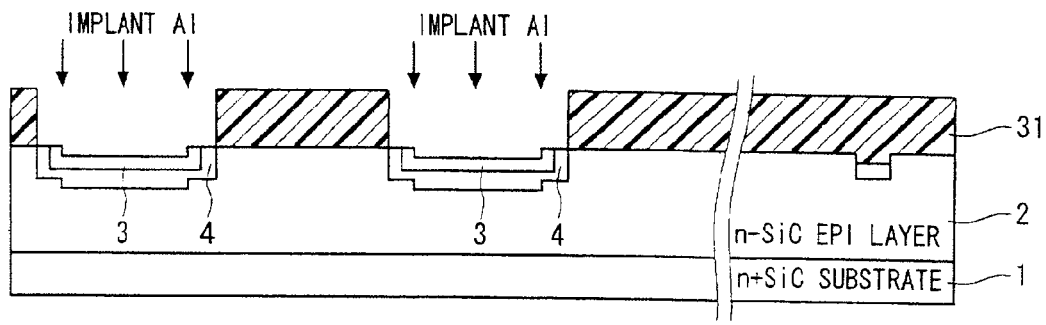
FIG. 20 is a sectional view showing the process of manufacturing the SiC semiconductor device according to the present invention.
Figure 21:
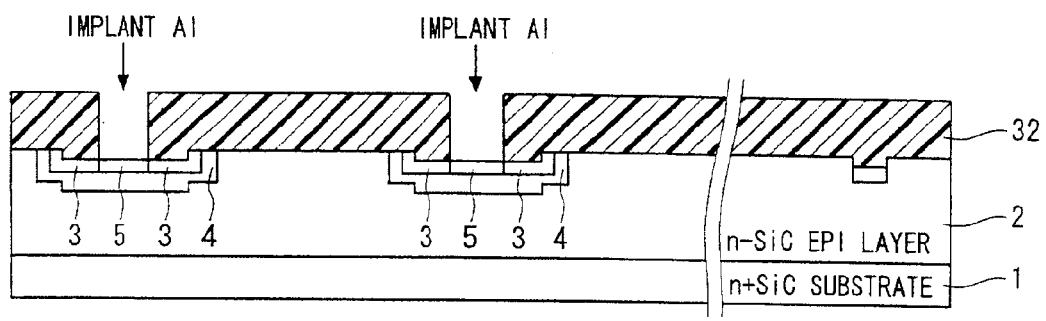
FIG. 21 is a sectional view showing the process of manufacturing the SiC semiconductor device according to the present invention.
Figure 22:
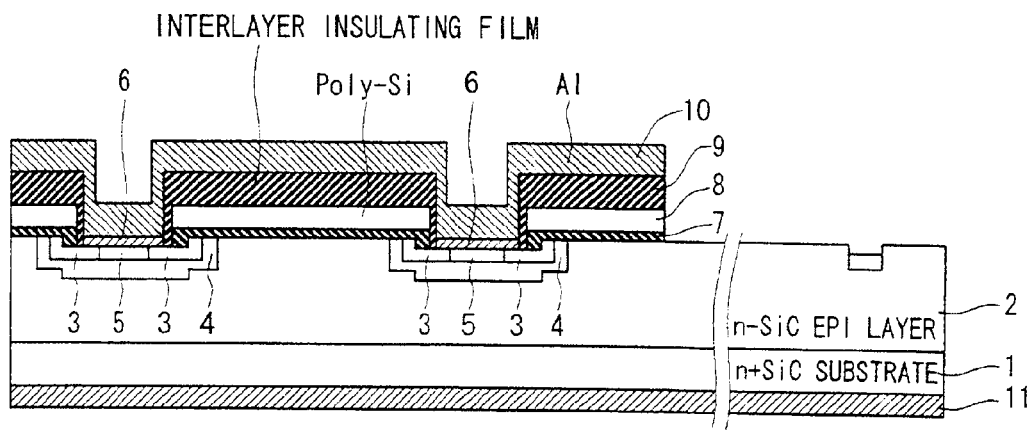
FIG. 22 is a sectional view showing the process of manufacturing the SiC semiconductor device according to the present invention.

Then, Al or B are ion-implanted by using the p-well implantation mask 31 which is aligned based on the recess of the mark region or the source region 3, to form a p-well region 4 (having a depth of 1.0 µm) (FIG. 20). In a subsequent step, similarly to the step of FIG. 10, the well contact region 5 is formed by using the well contact implantation mask 32 aligned based on the recess of the mark region or the source region 3 (FIG. 21). Moreover, high temperature activation annealing is performed, and the gate oxide film 7, the poly-Si gate electrode 8, the interlayer insulating film 9, the source electrode 6, the drain electrode 11, and the like, are sequentially formed. Thus, a MOSFET shown in FIG. 22 is completed. The source region 3 has a recess formed in a region thereof except a region near the end on the surface of the source region 3, and the region near the end has a hook shape curving toward an upper face of the SiC semiconductor layer. This enables the inversion layer to be stably formed on the wafer surface.

In this manner, the process of manufacturing the semiconductor device of this preferred embodiment includes the steps of (a) by using the single mask, forming recesses by etching regions of the SiC semiconductor layer which serves as the source region 3 (impurities implantation region) and the mark region, (b) by using the same mask as in the step (a), performing ion-implantation in the recesses which serve as the source region 3 and the mark region, at least from an oblique direction relative to the surface of the SiC semiconductor layer, and (c) aligning another mask based on at least the recess which serves as the impurities implantation region, and performing well implantation in a region containing the impurities implantation region. By performing the etching for the source region 3 and the mark region by using the single mask, the source region 3 can be formed without any misalignment relative to the mark region, and therefore a variation in the channel length can be suppressed. Moreover, by performing the ion-implantation from the oblique direction, the source region 3 can be formed also near the side face of the recess, so that an oxide film is not formed at the side face of the recess. Therefore, the inversion layer can be uniformly formed on the wafer surface.

The semiconductor device of this preferred embodiment thus formed has the n+SiC substrate 1, the n–SiC epi layer 2 (SiC semiconductor layer), the p-well regions 4 selectively formed on the surface of the SiC semiconductor layer, and the source regions 3 (impurities implantation regions) selectively formed on the surface of the p-well regions 4. The source region 3 has a recess formed in a region thereof except a region near the end on the surface of the source region 3, and the region near the end has a hook shape curving toward the upper face of the semiconductor layer. This enables the inversion layer to be uniformly formed on the wafer surface.

Also in the manufacturing process shown in FIGS. 12 to 16, the same effects can be obtained by performing angled implantation in the ion-implantation step. FIGS. 23 to 28 show a manufacturing process in which the angled implantation is performed in the ion-implantation step in the manufacturing process shown in FIGS. 12 to 16.

Figure 23:
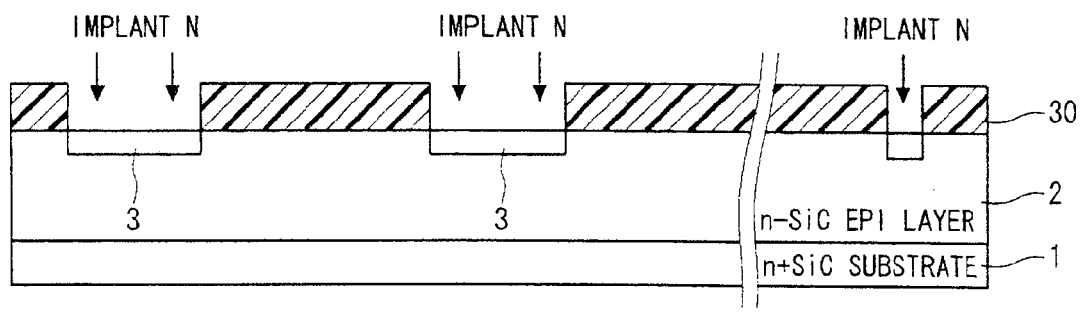
FIG. 23 is a sectional view showing a process of manufacturing an SiC semiconductor device according to the present invention.
Figure 24:
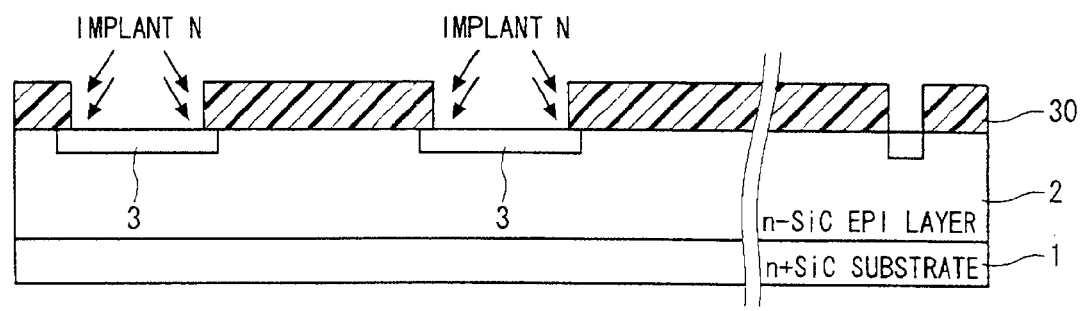
FIG. 24 is a sectional view showing the process of manufacturing the SiC semiconductor device according to the present invention.

Firstly, similarly to the process shown in FIGS. 12 to 16, in a semiconductor layer including the n+SiC substrate 1 and an n–SiC epi layer 2 formed on the n+SiC substrate 1, N or P are vertically ion-implanted in regions where the source region 3 and the mark region are to be formed, by using the single mask 30 (FIG. 23). Furthermore, the same ion-implantation is performed with rotation of the wafer, or performed obliquely at an angle of approximately 5 to 30° relative to the direction perpendicular to the wafer (FIG. 24).

Figure 25:
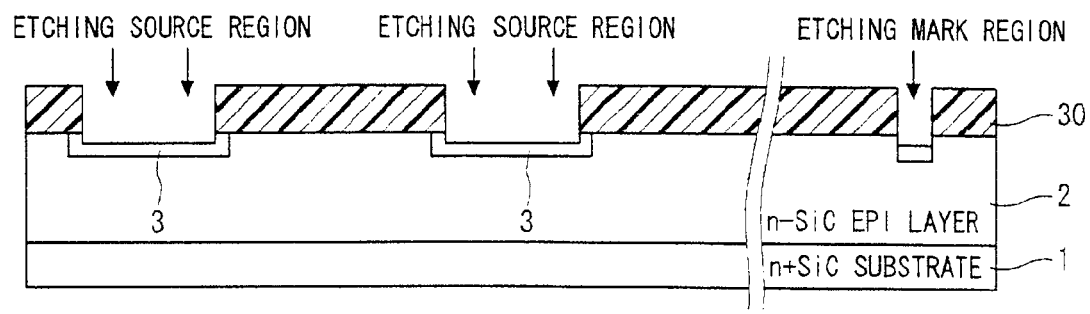
FIG. 25 is a sectional view showing the process of manufacturing the SiC semiconductor device according to the present invention.

Then, etching is performed by using the same mask 30 again, to form a recess (FIG. 25). Subsequently, similarly to the steps described with reference to FIGS. 14 and 15, the p-well region 4 (FIG. 26) and the well contact region 5 (FIG. 27) are formed based on the recess of the mark region or the source region 3. Moreover, high temperature activation annealing is performed, and the gate oxide film 7, the poly-Si gate electrode 8, the interlayer insulating film 9, the source electrode 6, the drain electrode 11, and the like, are sequentially formed. Thus, a MOSFET shown in FIG. 28 is completed.

The process of manufacturing the semiconductor device of this preferred embodiment includes the steps of (a) performing ion-implantation in regions of the SiC semiconductor layer which serve as the source region 3 (impurities implantation region) and the mark region, at least from an oblique direction relative to the surface of the SiC semiconductor layer, (b) by using the same mask as in the step (a), performing etching to partially remove the ion-implanted regions of the regions serving as the source region 3 and the mark region, to thereby form recesses, and (c) positioning another mask based on the recess of the region serving as the source region 3 or the mark region, and performing the well implantation in a region containing the source region 3. By performing the etching for the source region 3 and the mark region by using the single mask, the source region 3 can be formed without any misalignment relative to the mark region, and therefore a variation in the channel length can be suppressed. Moreover, by performing the ion-implantation from the oblique direction, the source region 3 is formed beyond the opening of the mask. When the recess is formed in the etching step, the source region 3 is formed also near the side face of the recess. Therefore, the inversion layer can be uniformly formed on the wafer surface. Additionally, since the etching is performed after the ion-implantation is performed in the source region 3, the source region 3 is not influenced by the etching and formed without a variation.

<Tapered Shape>

Figure 29:
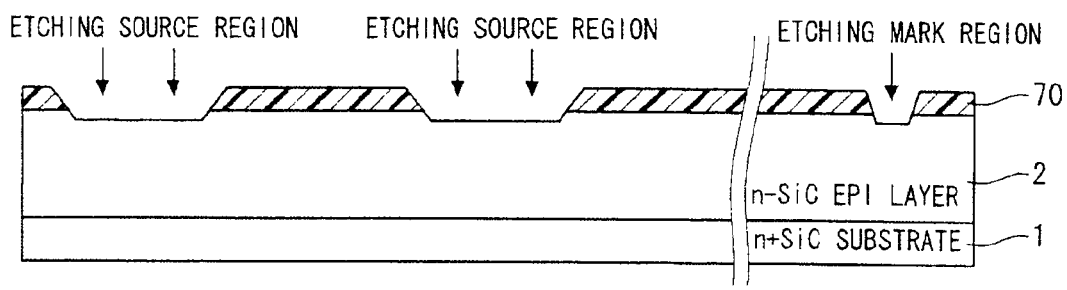
FIG. 29 is a sectional view showing a process of manufacturing an SiC semiconductor device according to the present invention.

FIGS. 29 to 34 show a process of manufacturing a MOSFET, in which a mask having a low selectivity relative to the SiC semiconductor layer (epi layer 2) is used in the etching step of FIG. 17. As shown in FIG. 29, when etching for the mark region and the source region 3 is performed on the SiC semiconductor layer by using a mask 70 having a low selectivity, an opening of the mask 70 has a tapered shape. The etching rate ratio is set to be (mask/SiC semiconductor layer) $\geq 1$.

Figure 30:
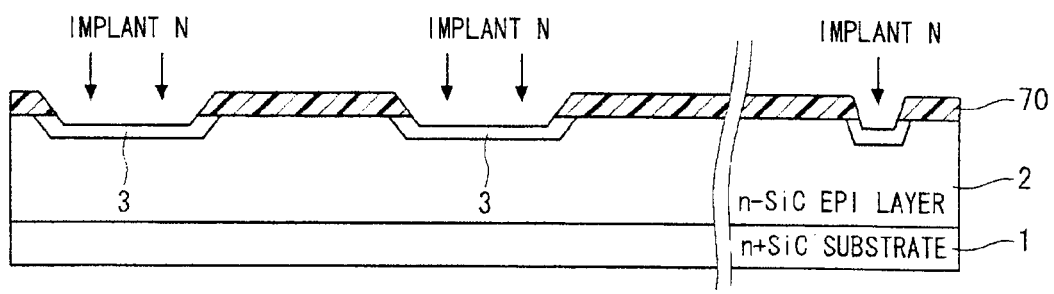
FIG. 30 is a sectional view showing the process of manufacturing the SiC semiconductor device according to the present invention.

Then, by using the same mask 70 again, ion-implantation is performed in the direction perpendicular to the wafer (FIG. 30). Since the mask 70 is formed into the tapered shape in the previous step, a portion of the mask 70 near a boundary between the mask 70 and the opening has a small thickness. Ions are, through the mask 70, implanted in a portion of the epi layer 2 located immediately below this portion of the mask 70. As a result, without performing the angled implantation, the source region 3 is stably formed near the side face of the recess, so that an end portion of the source region 3 has a tapered shape. This enables an inversion layer to be stably formed on the wafer surface.

Figure 31:
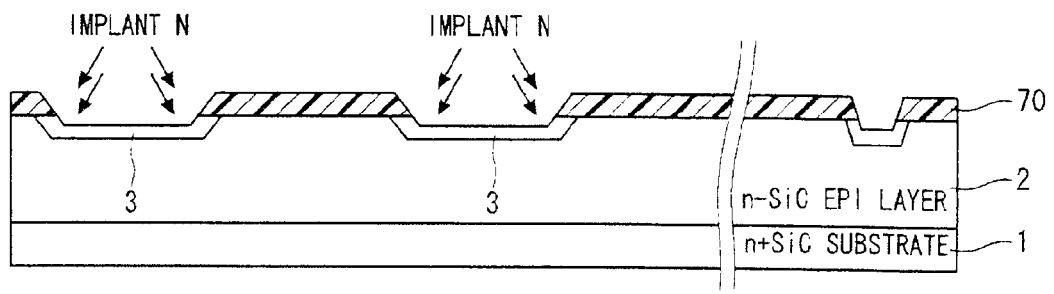
FIG. 31 is a sectional view showing the process of manufacturing the SiC semiconductor device according to the present invention.

However, angled implantation may be additionally performed to form the source region 3 near the side face of the recess. In this case, the ion-implantation is performed with rotation of the wafer, or performed obliquely at an angle of approximately 5 to 30° relative to the direction perpendicular to the wafer (FIG. 31).

Figure 32:
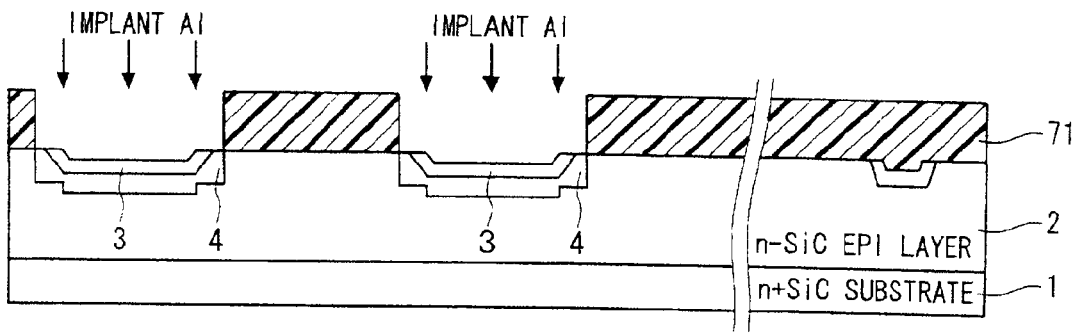
FIG. 32 is a sectional view showing the process of manufacturing the SiC semiconductor device according to the present invention.
Figure 33:
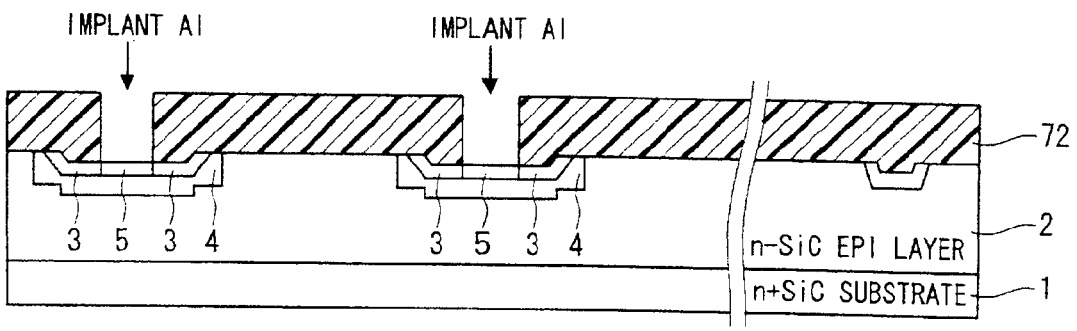
FIG. 33 is a sectional view showing the process of manufacturing the SiC semiconductor device according to the present invention.
Figure 34:
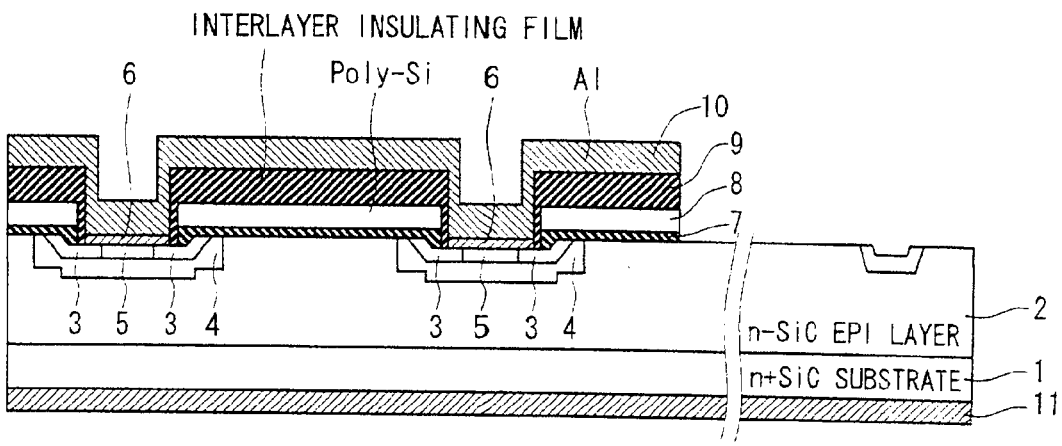
FIG. 34 is a sectional view showing the process of manufacturing the SiC semiconductor device according to the present invention.

Subsequent steps are the same as shown in FIGS. 7 to 11, and the p-well region 4 and the well contact region 5 are formed (FIGS. 32 and 33). Moreover, high temperature activation annealing is performed, and the gate oxide film 7, the poly-Si gate electrode 8, the interlayer insulating film 9, the source electrode 6, the drain electrode 11, and the like, are sequentially formed. Thus, a MOSFET shown in FIG. 34 is completed.

Figure 35:
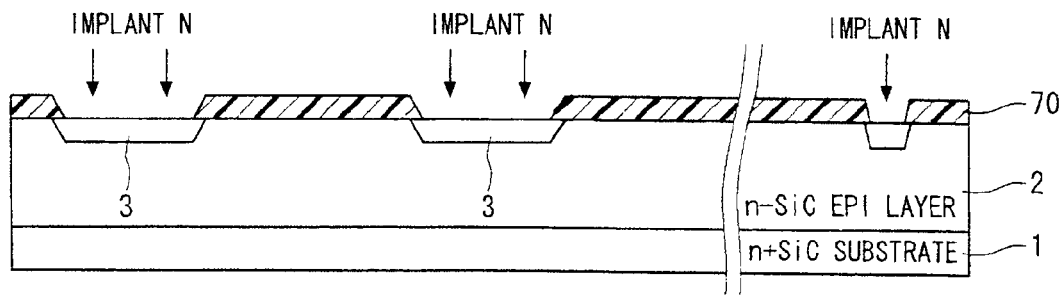
FIG. 35 is a sectional view showing a process of manufacturing an SiC semiconductor device according to the present invention.

FIGS. 35 to 40 show a manufacturing process in which a mask having a tapered shape is used in the ion-implantation step of FIG. 23 included in the MOSFET manufacturing process shown in FIGS. 23 to 28 in which the etching is performed after the source implantation. FIG. 35 shows a step of performing ion-implantation by using a mask 70 provided with tapered-shaped openings due to post-baking. When N ions are implanted in the direction perpendicular to the wafer, the ion-implantation is also performed, through the mask 70, in a region located immediately below a thinned portion of the mask 70 around the opening. As a result, without an angled implantation, the source region 3 is formed beyond the opening of the mask 70, and an end portion of the source region has a tapered shape.

Figure 36:
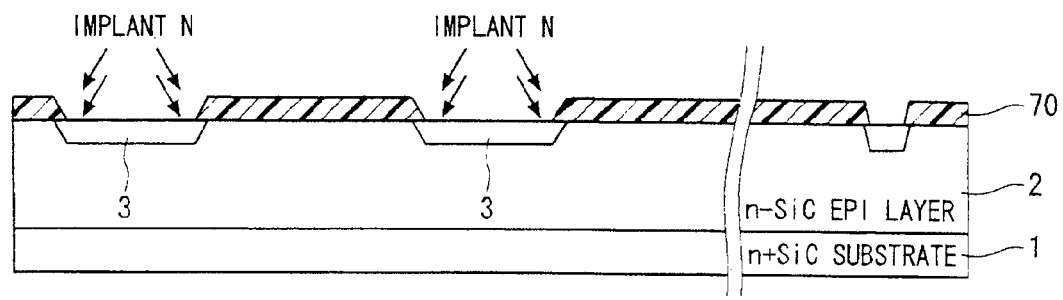
FIG. 36 is a sectional view showing the process of manufacturing the SiC semiconductor device according to the present invention.

However, an angled implantation may be additionally performed to form the source region 3 beyond the opening of the mask 70. In this case, the ion-implantation is performed with rotation of the wafer, or performed obliquely at an angle of approximately 5 to 30° relative to the direction perpendicular to the wafer (FIG. 36).

Figure 37:
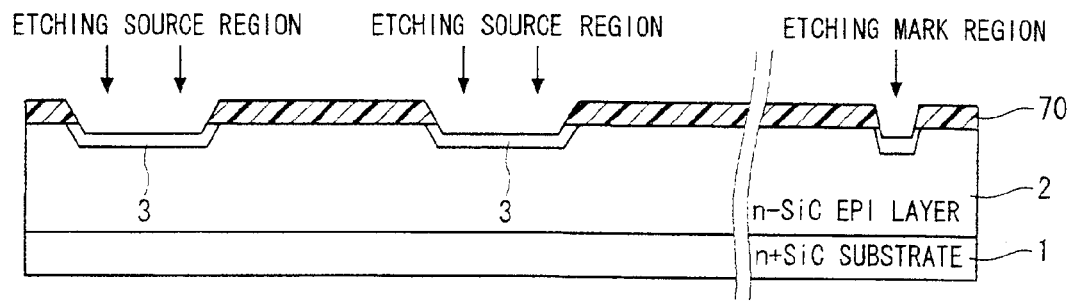
FIG. 37 is a sectional view showing the process of manufacturing the SiC semiconductor device according to the present invention.

Then, etching for the source region 3 is performed by using the same mask 70 again (FIG. 37). Thus, a recess is formed in the source region 3. Since the source region 3 is formed beyond a region corresponding to the opening of the mask 70, the source region 3 is formed near the side face of the recess, too.

Figure 26:
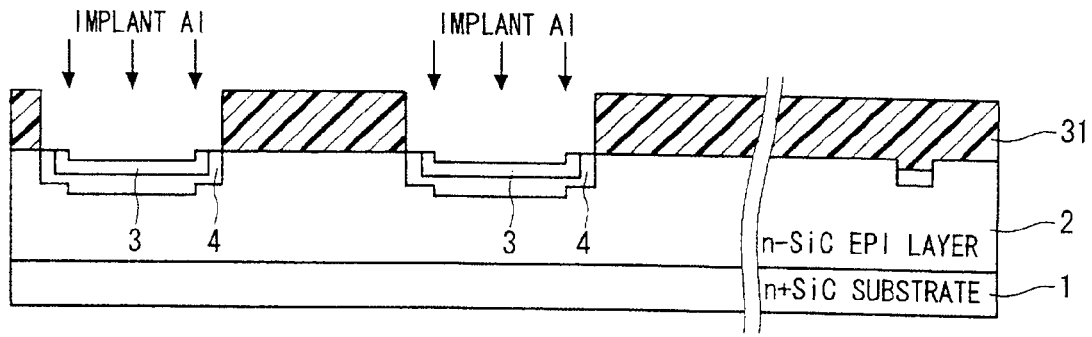
FIG. 26 is a sectional view showing the process of manufacturing the SiC semiconductor device according to the present invention.
Figure 27:
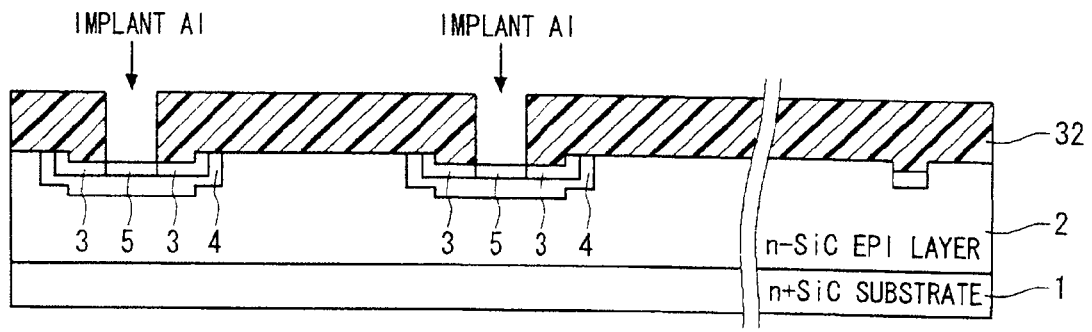
FIG. 27 is a sectional view showing the process of manufacturing the SiC semiconductor device according to the present invention.
Figure 28:
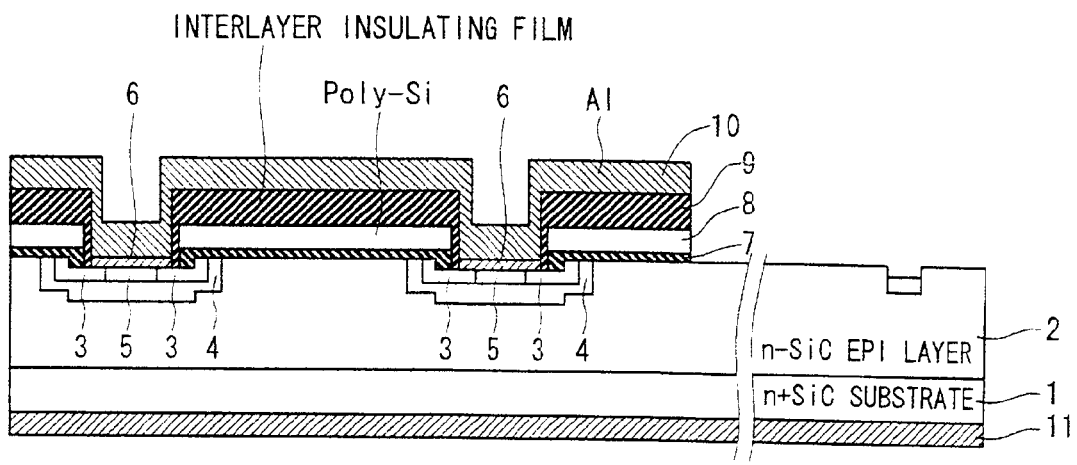
FIG. 28 is a sectional view showing the process of manufacturing the SiC semiconductor device according to the present invention.
Figure 38:
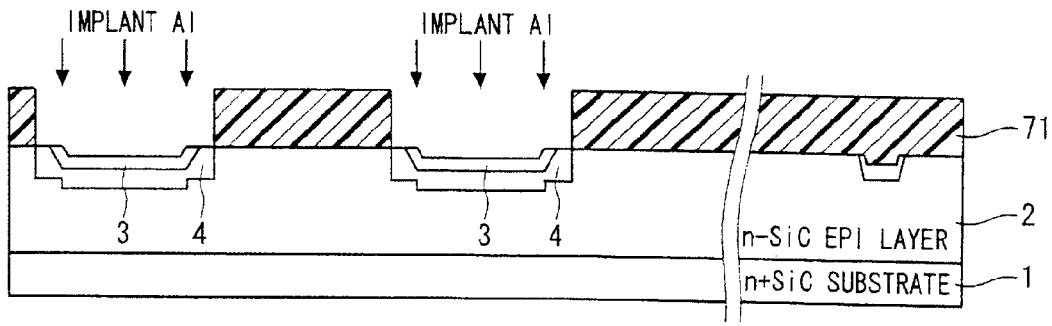
FIG. 38 is a sectional view showing the process of manufacturing the SiC semiconductor device according to the present invention.
Figure 39:
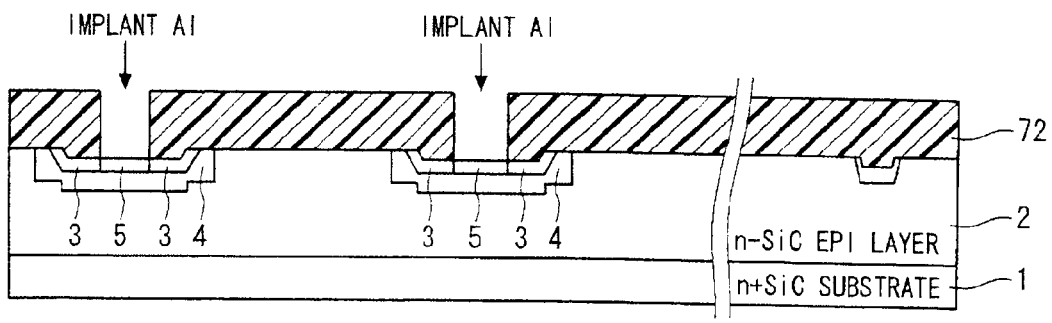
FIG. 39 is a sectional view showing the process of manufacturing the SiC semiconductor device according to the present invention.
Figure 40:
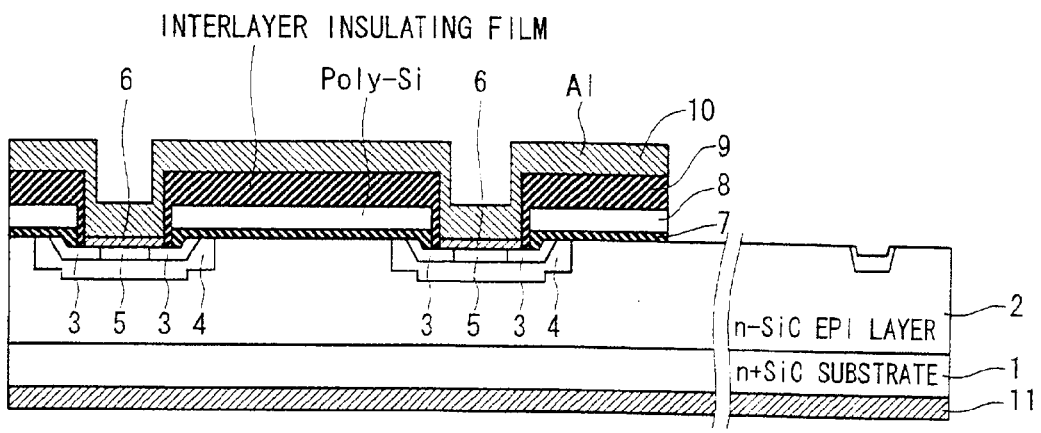
FIG. 40 is a sectional view showing the process of manufacturing the SiC semiconductor device according to the present invention.

Subsequent steps are the same as shown in FIGS. 26 to 28, and the p-well region 4 and the well contact region 5 are formed (FIGS. 38 and 39). Moreover, high temperature activation annealing is performed, and the gate oxide film 7, the poly-Si gate electrode 8, the interlayer insulating film 9, the source electrode 6, the drain electrode 11, and the like, are sequentially formed. Thus, a MOSFET shown in FIG. 40 is completed. The source region 3 has a recess formed in a region thereof except a region near the end on the surface of the source region 3, and the region near the end has a hook shape curving toward the upper face of the semiconductor layer. This enables the inversion layer to be stably formed on the wafer surface.

Although the MOSFET has been described above, the IGBT differs from MOSFET only in a structure at a back surface side of the substrate (in a case of the MOSFET, the drain side), and has the same structure as that of the MOSFET in terms of a front surface side. Therefore, the above-described manufacturing process is applicable to the IGBT, too, and exerts the effect that controllability of the channel length is improved.

<Effect>

The semiconductor device of this preferred embodiment exerts the following effects. The semiconductor device of this preferred embodiment thus formed has the n+SiC substrate 1, the n−SiC epi layer 2 (SiC semiconductor layer), the p-well regions 4 selectively formed on the surface of the SiC semiconductor layer, and the source regions 3 (impurities implantation regions) selectively formed on the surface of the p-well regions 4. The impurities implantation region has a recess formed in a region thereof except a region near the end on the surface of the impurities implantation region, and the region near the end has a hook shape curving toward the upper face of the semiconductor layer. This enables the inversion layer to be uniformly formed on the wafer surface.

Additionally, the end portion of the impurities implantation region has a tapered shape. This configuration also enables the inversion layer to be uniformly formed on the wafer surface.

The first method of manufacturing the semiconductor device of this preferred embodiment exerts the following effects. The first method of manufacturing the semiconductor device of this preferred embodiment includes the steps of (a) by using a single mask, forming recesses by etching regions of the SiC semiconductor layer which serve as the source region 3 (impurities implantation region) and the mark region, (b) by using the same mask as in the step (a), performing ion-implantation in the recesses which serve as the source region 3 and the mark region, at least from an oblique direction relative to the surface of the SiC semiconductor layer, and (c) aligning another mask based on the recess of the region which serves as the source region 3 or the mark region, and performing well implantation in a region containing the source region 3. By performing the etching for the source region 3 and the mark region by using the single mask, the source region 3 can be formed without any misalignment relative to the mark region, and therefore a variation in the channel length can be suppressed. Moreover, by performing the ion-implantation from the oblique direction, the source region 3 can be formed also at the side face of the recess. Therefore, the inversion layer can be uniformly formed on the wafer surface.

The second method of manufacturing the semiconductor device of this preferred embodiment includes the steps of (a) by using a single mask, performing ion-implantation in regions of the SiC semiconductor layer which serve as the source region 3 (impurities implantation region) and the mark region, at least from an oblique direction relative to the surface of the SiC semiconductor layer, (b) by using the same mask as in the step (a), performing etching to partially remove the ion-implanted regions of the regions serving as the source region 3 and the mark region, to thereby form recesses, and (c) positioning another mask based on the recess of the region serving as the source region 3 or the mark region, and performing the well implantation in a region containing the source region 3. By performing the etching for the source region 3 and the mark region by using the single mask, the source region 3 can be formed without any misalignment relative to the mark region, and therefore a variation in the channel length can be suppressed. Moreover, by performing the ion-implantation from the oblique direction, the source region 3 can be formed also at the side face of the recess, so that the inversion layer can be uniformly formed on the wafer surface. Additionally, since the etching is performed after the ion-implantation is performed in the formation of the source region 3, the source region 3 is not influenced by the etching and formed without a variation.

The third method of manufacturing the semiconductor device of this preferred embodiment includes the steps of (a) by using a single mask having a low selectivity relative to the SiC semiconductor layer, forming recesses by etching regions of the SiC semiconductor layer which serve as the impurities implantation region (source region 3) and the mark region, (b) by using the same mask as in the step (a), performing ion-implantation in the recesses which serve as the source region 3 and the mark region, and (c) aligning another mask based on the recess of the region which serves as the source region 3 or the mark region, and performing well implantation in a region containing the source region 3. Since the etching is performed by using the mask having a low selectivity relative to the SiC semiconductor layer, the opening of the mask 70 is formed into a tapered shape. Therefore, the thickness of the mask 70 is small in a region near the boundary of the opening. Ions are, through the mask 70, implanted also in a portion of the SiC semiconductor layer located immediately below the region. Therefore, the source region 3 can be stably formed near the side face of the recess, to enable the inversion layer to be uniformly formed on the wafer surface. Furthermore, the end portion of the source region 3 is formed into a tapered shape, and therefore there is no steeply-angled portion. Thus, breakdown caused by electric field concentration can be prevented.

Moreover, in the step (b), the ion-implantation is performed at least from an oblique direction relative to the surface of the SiC semiconductor layer. This enables the source region 3 to be stably formed near the side face of the recess, so that the inversion layer can be uniformly formed on the wafer surface.

The fourth method of manufacturing the semiconductor device of this preferred embodiment includes the steps of (a) by using the single mask having tapered-shaped openings, performing ion-implantation in regions of the SiC semiconductor layer which serve as the impurities implantation region (source region 3) and the mark region, (b) by using the same mask as in the step (a), performing etching to partially remove the ion-implanted regions of the regions serving as the source region 3 and the mark region, to thereby form recesses, and (c) positioning another mask based on the recess of the region serving as the source region 3 or the mark region, and performing the well implantation in a region containing the source region 3. Since the opening of the mask 70 is formed into a tapered shape, the thickness of the mask 70 is small in a region near the boundary of the opening. Ions are, through the mask 70, implanted also in a portion of the SiC semiconductor layer located immediately below the region. Therefore, the source region 3 can be stably formed near the side face of the recess, to enable the inversion layer to be uniformly formed on the wafer surface. Furthermore, the end portion of the source region 3 is formed into a tapered shape, and therefore there is no steeply-angled portion. Thus, breakdown caused by electric field concentration can be prevented. Additionally, since the etching is performed after the ion-implantation is performed in the formation of the source region 3, the source region 3 is not influenced by the etching and formed without a variation.

Moreover, in the step (a), the ion-implantation is performed at least from an oblique direction relative to the surface of the SiC semiconductor layer. This enables the source region 3 to be stably formed near the side face of the recess, so that the inversion layer can be uniformly formed on the wafer surface.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SiC semiconductor layer;
   a well region selectively formed on a surface of said SiC semiconductor layer; and
   an impurities implantation region selectively formed on a surface of said well region,
   wherein said impurities implantation region has a recess formed in a region thereof except a region near an end portion on a surface of said impurities implantation region, and said region near the end portion has a hook-like shape curving toward an upper face of said semiconductor layer.

2. The SiC semiconductor device according to claim 1, wherein an end face of said impurities implantation region has a tapered shape.

* * * * *